United States Patent
Lee et al.

(10) Patent No.: US 9,698,828 B2
(45) Date of Patent: Jul. 4, 2017

(54) METHOD OF PERFORMING TWO-DIMENSIONAL INTERLEAVING, AND RECORDING MEDIUM, AND APPARATUS FOR PERFORMING THE SAME

(71) Applicant: Foundation of Soongsil University-Industry Cooperation, Seoul (KR)

(72) Inventors: Jaejin Lee, Seoul (KR); Seongkwon Jeong, Seoul (KR)

(73) Assignee: Foundation of Soongsil University-Industry Cooperation, Seoul (KR)

( * ) Notice: Subject to any disclaimer, the term of this patent is extended or adjusted under 35 U.S.C. 154(b) by 44 days.

(21) Appl. No.: 14/855,488

(22) Filed: Sep. 16, 2015

(65) Prior Publication Data
US 2017/0019127 A1   Jan. 19, 2017

(30) Foreign Application Priority Data
Jul. 15, 2015 (KR) .......................... 10-2015-0100238

(51) Int. Cl.
| | | |
|---|---|---|
| *H03M 13/17* | (2006.01) | |
| *H03M 13/27* | (2006.01) | |
| *G11B 7/007* | (2006.01) | |

(52) U.S. Cl.
CPC ..... *H03M 13/2703* (2013.01); *G11B 7/00772* (2013.01); *H03M 13/2778* (2013.01)

(58) Field of Classification Search
CPC ...................................................... H03M 13/17
(Continued)

(56) References Cited

U.S. PATENT DOCUMENTS 5,646,935 A * 7/1997 Ishikawa ............. H04L 27/2604
370/207
6,307,962 B1 * 10/2001 Parker ....................... G06T 9/00
382/170
(Continued)

FOREIGN PATENT DOCUMENTS

| KR | 10-2001-0038383 A | 5/2001 |
| KR | 10-0738980 B1 | 7/2007 |
| KR | 10-2009-0076779 A | 7/2009 |

OTHER PUBLICATIONS

Junghyun Park et al. "Distributed Interleaving for 2-Dimensional Burst Errors underlaying Holographic Data Storage System" Proceedings of Symposium of the Korean Institute of Communications and Information Sciences, Fall 2014, pp. 276-277 (Nov. 2014).

*Primary Examiner* — Fritz Alphonse
(74) *Attorney, Agent, or Firm* — Novick, Kim & Lee, PLLC; Sang Ho Lee

(57) ABSTRACT

A two-dimensional interleaving method is provided. The two-dimensional interleaving method includes dividing a first page having $N^2 \times N^2$ pixels, N being a natural number, into a plurality of blocks, wherein each of the plurality of blocks includes N×N pixels, rearranging each of the plurality of the blocks of the first page into a second page, wherein each of two index located at same position in two adjacent block of the first page, respectively, is rearranged to have at least a dispersion distance D in the second page, and relocating an index pixel located at same position of each of the plurality of the blocks of the first page into a k-th block of the second page.

15 Claims, 11 Drawing Sheets

(58) Field of Classification Search
USPC .......................................... 714/762, 764, 752
See application file for complete search history.

(56) References Cited

U.S. PATENT DOCUMENTS

| | | | |
|---|---|---|---|
| 2003/0108114 A1* | 6/2003 | Bocko | H03M 13/2721 375/265 |
| 2006/0107173 A1* | 5/2006 | Kondou | G11B 20/1833 714/752 |
| 2007/0266274 A1 | 11/2007 | Lin | |
| 2010/0232047 A1* | 9/2010 | Cherubini | G11B 20/1202 360/48 |

* cited by examiner

```
x=0, y=0;                          x=x+D
for(k=1; k<=N²; K++)               if(x>=N²)
{                                     x=x-N²+N;
   for(i=1; 1<=N; i++)             if(k+1)mod N ==0)
   {                               {
     for(j=1; j<=N; j++)            y=y+D;
     {                              x=0;
        Bₖ[i][j]=B[x+i][y+i];      }
     }                              if(y>=N²)
   }                                   y=y-N²+N;
}                                  }
```

FIG. 8

METHOD OF PERFORMING TWO-DIMENSIONAL INTERLEAVING, AND RECORDING MEDIUM, AND APPARATUS FOR PERFORMING THE SAME

CROSS-REFERENCE TO RELATED APPLICATION

This application claims priority to and the benefit of Korean Patent Application No. 10-2015-0100238, filed on Jul. 15, 2015, the disclosure of which is incorporated herein by reference in its entirety.

BACKGROUND

The present disclosure relates to a method of performing two-dimensional interleaving to secure a dispersion distance and a recording medium and apparatus for performing the same, and more particularly, to a method of performing two-dimensional interleaving in which pixels are spaced equidistantly to secure the dispersion distance when a two-dimensional burst error occurs in a communication system or information storage device that processes data in a two-dimensional manner.

Holographic data storage (HDS) is an optical storage device using hologram. Three key characteristics of HDS are a large scale, a high data input/output speed, and a short data access time. However, HDS has errors such as interference between adjacent symbols, interference between adjacent pages, deviation, and a two-dimensional burst error.

In order to address the two-dimensional burst error, several interleaving techniques such as a block interleaver, a cyclic shift interleaver, a helical interleaver, and a random interleaver have been proposed.

First, referring to FIG. 1, a block interleaver changes a data alignment direction from a transverse direction to a longitudinal direction and determines the transverse direction as a reading direction. This method is efficient when data is input or output in a line, but is useless when data is written or read in a two-dimensional manner.

Referring to FIG. 2, a cyclic shift interleaver may determine an amount of shift and then shift bits by the amount.

Referring to FIG. 3, first, a helical interleaver reads from data in a first row and a first column to data in a last row and a last column in a diagonal line. Next, the helical interleaver reads from data in a second row and the first column to the end in a diagonal line and then reads from data in a third row and the first column to the end in a diagonal line. In this method, upon arriving at the last row, the helical interleaver moves to a row containing unread data and repeats the above process until all the data is read. An equation is as follows:

$$j=i(n_x+1)\bmod(n_x n_y), i=\{0, 1, 2, \ldots, n_x n_y-1\}$$

where i is an index of an original, j is a helical index, $n_x$ is the number of bits in an x-th row, and $n_y$ is the number of bits in a yth row.

A random interleaver generates a random number and exchanges an index corresponding to the random number and data. It will be appreciated that de-interleaving is possible only when it is known how data is changed in the interleaving.

However, since the conventional interleavers have been developed in consideration of a system in which data is input/output in a line, the interleavers have limitations in that they cannot evenly spread a two-dimensional burst error over the entire page.

SUMMARY OF THE DISCLOSURE

According to one embodiment of the present disclosure, a two-dimensional interleaving method is provided. The two-dimensional interleaving method includes dividing a first page having $N^2 \times N^2$ pixels, N being a natural number, into a plurality of blocks, wherein each of the plurality of blocks includes N×N pixels, rearranging each of the plurality of the blocks of the first page into a second page, wherein each of two index located at same position in two adjacent block of the first page, respectively, is rearranged to have at least a dispersion distance D in the second page, and relocating an index pixel located at same position of each of the plurality of the blocks of the first page into a k-th block of the second page.

The relocating uses the following equation: $\pi_k[i,j]=B_{[i-1]\times N+j}[\lfloor k/N \rfloor+1, k \bmod N]$, $k=1, 2, \ldots, N^2$ and $i=j=1, 2, \ldots, N$. Here, $\pi$ denotes a block of the second page in which the index pixel is relocated, k denotes a natural number, [i, j] denotes an index, and B denotes a block of the first page. [[k/N]+1, k mod N]th-pixel of each and every of the plurality of blocks of the first page is sequentially mapped into the k-th block of the second page in an order of the plurality of blocks of the first page.

The relocating further comprise to use a pseudo code. The two-dimensional interleaving method further comprises outputting the second page.

According to another aspect of the present disclosure, there is provided a computer-readable recording medium recording a computer program for executing the two-dimensional interleaving method that secures the dispersion distance.

According to the other aspect of the present disclosure, there is provided a two-dimensional interleaving apparatus that secures a dispersion distance, the two-dimensional interleaving apparatus including; a block division unit configured to divide an input data page having $N^2 \times N^2$ pixels (N is a natural number) into N×N blocks each having N×N pixels; a block rearrangement unit configured to reconfigure block numbers of the N×N blocks to secure a minimum dispersion distance D between pixels of the same index in adjacent blocks; and a mapping unit configured to move the pixels to map the pixels of the same index in the blocks of the input data page to a reconfigured kth block.

The mapping unit may move the pixels using the following equation:

$$\pi_k[i,j]=B_{[i-1]\times N+j}[\lfloor k/N \rfloor+1, k \bmod N], k=1, 2, \ldots,$$
$$N^2 \text{ and } i=j=1, 2, \ldots, N$$

where $\pi$ is a block in which a pixel is moved, k is a block number, [i, j] is an index of a block, and B is a block of an input data page.

The block rearrangement unit may reconfigure the block numbers of the N×N blocks using a pseudo code.

The two-dimensional interleaving apparatus may further include an output unit configured to output a modified page in which neighboring pixels of the input data page are mapped to be spaced the minimum dispersion distance D apart.

BRIEF DESCRIPTION OF THE DRAWINGS

The above and other objects, features and advantages of the present disclosure will become more apparent to those of ordinary skill in the art by describing in detail exemplary embodiments thereof with reference to the accompanying drawings, in which:

FIG. 8 illustrates a pseudo code for rearranging a block according to the present disclosure;

DETAILED DESCRIPTION OF EXEMPLARY EMBODIMENTS

Figure 1:
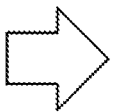
FIG. 1 is a schematic diagram illustrating a block interleaver technique for solving a conventional burst error.
Figure 2:
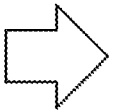
FIG. 2 is a schematic diagram illustrating a cyclic shift interleaver technique for solving a conventional burst error.
Figure 3:
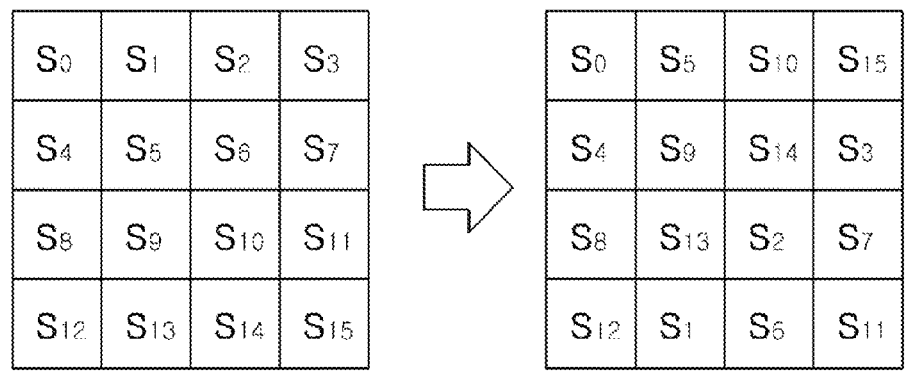
FIG. 3 is a schematic diagram illustrating a helical interleaver technique for solving a conventional burst error.

In the following detailed description, reference is made to the accompanying drawings, which show specific embodiments in which the disclosure may be practiced. These embodiments will be described in sufficient detail to enable those skilled in the art to practice the present disclosure. It is to be understood that the various embodiments of the present disclosure, although different, are not necessarily mutually exclusive. For example, a particular feature, structure or characteristic described herein in connection with one embodiment may be implemented within other embodiments without departing from the spirit and scope of the present disclosure. In addition, it is to be understood that the location or arrangement of individual elements within each disclosed embodiment may be modified without departing from the spirit and scope of the present disclosure. The following detailed description is, therefore, not to be taken in a limiting sense, and the scope of the present disclosure is defined only by the appended claims, appropriately interpreted, along with the full range of equivalents to which the claims are entitled. In the drawings, like numerals refer to the same or similar elements throughout the several views.

Hereinafter, preferred embodiments of the present disclosure will be described in more detail with reference to the accompanying drawings.

Figure 4:
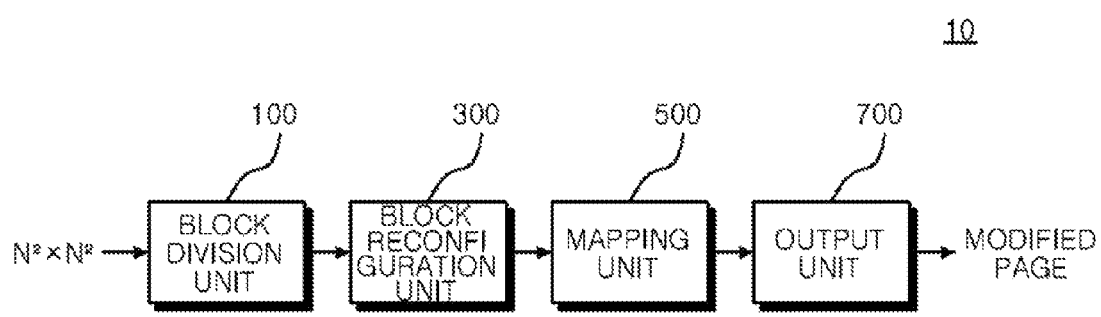
FIG. 4 is a block diagram of a two-dimensional interleaving apparatus that secures a dispersion distance according to an embodiment of the present disclosure.

FIG. 4 is a block diagram of a two-dimensional interleaving apparatus 10 that secures a dispersion distance according to an embodiment of the present disclosure.

A two-dimensional interleaving apparatus 10 ("an apparatus") that secures a dispersion distance according to an embodiment of the present disclosure is an interleaver that evenly spreads a burst error generated in a communication and information storage channel over the entire page.

When the two-dimensional burst error is generated by a communication system or an information storage apparatus that processes data such as a holographic data storage channel in a two-dimensional manner, the degradation in performance of a bit error ratio is more serious upon signal detection. Accordingly, an arrangement of input data is changed to transform the burst error into a possible random error, which is called an interleaver.

Referring to FIG. 4, the apparatus 10 according to an embodiment of the present disclosure includes a block division unit 100, a block rearrangement unit 300, and a mapping unit 500. The apparatus 10 may further include an output unit 700.

Elements of the apparatus 10 will be simply described below, and the two-dimensional interleaving method that secures the dispersion distance according to an embodiment of the present disclosure will be described in detail with reference to FIGS. 5 to 13.

The block division unit 100 is configured to divide an input data page (first page) having $N^2 \times N^2$ pixels (N is a natural number) into N×N blocks. Each block will have N×N pixels. The N×N blocks in the input data page (first page) are numbered in sequence. The numbering sequence may be in a row direction order or a column direction order.

The block rearrangement unit 300 rearranges block numbers by determining block numbers of the N×N blocks to secure a minimum dispersion distance D between pixels having the same index in adjacent blocks.

The numbering for rearranging the blocks may be performed using a predetermined rule, for example, a pseudo code.

The mapping unit 500 is configured to relocate pixels such that pixels of the same index in the blocks of the input data page (first page) are mapped to a $k^{th}$ block of the determined block number. In this case, the pixels may be relocated according to a determined relocation rule.

The relocation rule of the pixels may allow the pixels of the same index of each and every blocks of the input data page to be mapped to the rearranged k-th block in an order of original block numbers of the input data page (first page).

The output unit 700 outputs a modified second page in which neighboring pixels of the input data page (first page) are mapped to be spaced at the minimum dispersion distance D apart one another.

The second page is a result of two-dimensional data interleaving performed by the apparatus 10 and since burst errors occurring in the input data are spread out over the entire page, the burst errors are equidistant.

Software (application) for performing two-dimensional data interleaving that secures a dispersion distance may be installed in and executed on the apparatus 10 according to an embodiment of the present disclosure. The block division unit 100, the block rearrangement unit 300, the mapping unit 500, and the output unit 700 may be controlled by the software program for performing the two-dimensional data interleaving executed on the apparatus 10.

The apparatus 10 may be a data storage device or a communication device and for example, the apparatus 10 may be a holographic data storage device or a flash memory.

In the field of communication and storage devices, burst errors occurring when data passes through a channel may cause a situation in which data recovery is impossible. Accordingly, most transceiver chipsets have an interleaver (transmitting end) and/or a deinterleaver (receiving end) that may serve to transform the burst error into a possible random error by spreading the burst error.

Accordingly, the apparatus 10 may be substituted for the existing interleaver and/or deinterleaver in such a transceiver chipset. In particular, similar to the holographic data storage apparatus, the apparatus 10 is utilized in a channel that causes a two-dimensional burst error.

The apparatus 10 may be a separate terminal or a module of the terminal. In addition, the block division unit 100, the block rearrangement unit 300, the mapping unit 500, and the output unit 700 may be configured as an integrated module or configured with one or more modules. Alternatively, each element may be configured as a separate module.

The apparatus 10 may be mobile or fixed. The apparatus 10 may be configured as a server or engine and may be referred to as other terminologies such as "device," "terminal," "user equipment (UE)," "mobile station (MS)," "wireless device," or "handheld device."

The apparatus 10 may execute or produce a variety of software on the basis of an operating system (OS), that is, any system. The operating system is a system program for allowing software to use hardware of the device and may include mobile computer operating systems such as Android OS, iOS, Window Mobile OS, Bada OS, Symbian OS, and a Blackberry OS as well as computer operating systems such as Window series, Linux series, UNIX series, MAC, AIX, and HP-UX.

Figure 5:
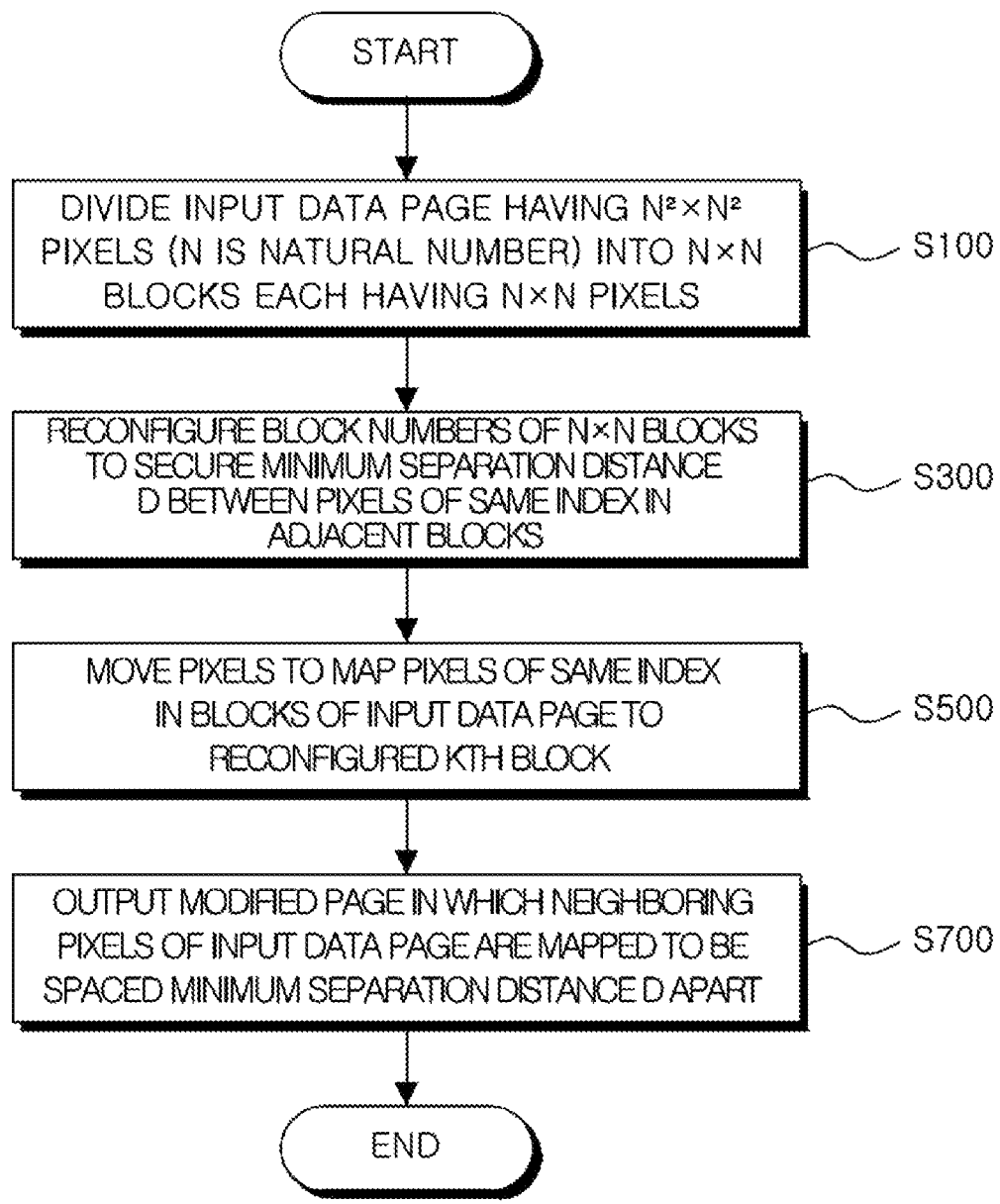
FIG. 5 is a flowchart illustrating a two-dimensional interleaving method that secures a dispersion distance according to an embodiment of the present disclosure.
Figure 6:
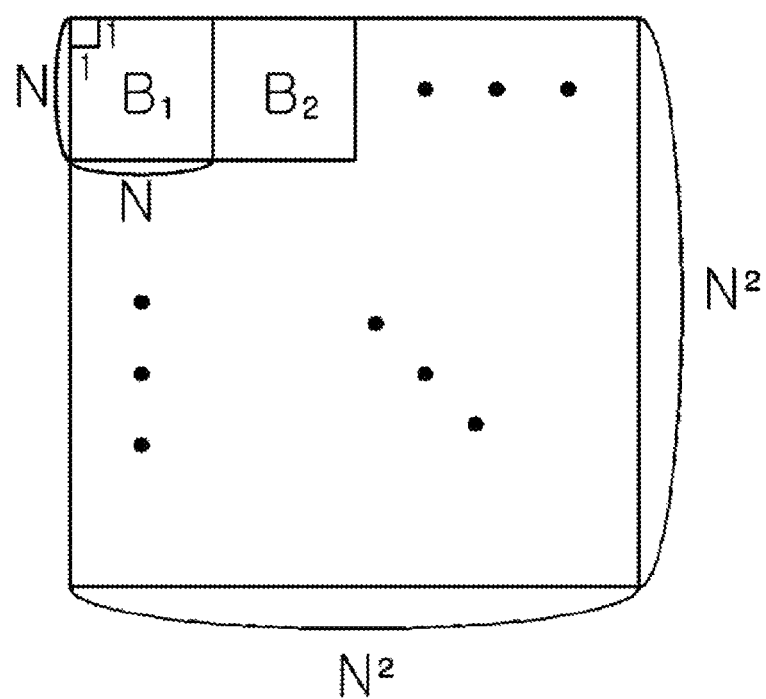
FIG. 6 is a schematic diagram showing a page and a block of the present disclosure.

FIG. 5 is a flowchart illustrating a two-dimensional interleaving method that secures a dispersion distance according to an embodiment of the present disclosure. FIG. 6 is a schematic diagram showing a page and a block of the present disclosure.

The two-dimensional interleaving method that secures the dispersion distance according to an embodiment of the present disclosure may be performed using, substantially, the same configuration as the apparatus 10 of FIG. 4. Accordingly, the same element as the apparatus 10 of FIG. 4 is assigned the same reference numeral, and its detailed description will be omitted. The two-dimensional interleaving method that secures the dispersion distance according to an embodiment of the present disclosure may be executed by software (an application) for performing the two-dimensional interleaving method.

Referring to FIGS. 5 and 6, two-dimensional input data has $N^2 \times N^2$ pixels (N is a natural number) and is defined as a page. According to the two-dimensional interleaving method according to an embodiment of the preset disclosure, a page having $N^2 \times N^2$ pixels is divided into N×N blocks, in which each has N×N pixels (S100).

Thus, the input N×N pixels are numbered in sequence (e.g., $B_1, B_2, B_3, \ldots, B_{N \times N}$ in an order of the row direction).

After the input data page is divided into N×N blocks, block numbers are reconfigured to secure a minimum dispersion distance D between pixels having the same index in adjacent blocks (S300). That is, the input N×N blocks are numbered such that neighboring blocks in the input N×N blocks are spaced the minimum dispersion distance D which is a predetermined pixel distance apart.

Figure 7:
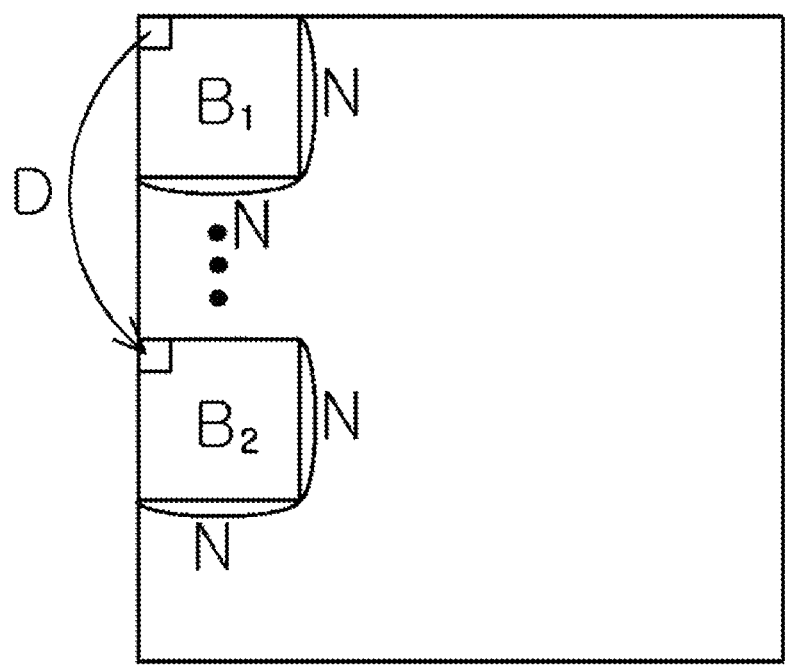
FIG. 7 is a schematic diagram illustrating a rule of reconfiguring a block according to the present disclosure.

Referring to FIG. 7, a first block $B_1$ and a second block $B_2$ which are adjacent to one another in the input data page are spaced further from each other depending on the minimum dispersion distance D. For example, assuming pixels indexed by [1, 1] in respective blocks, a pixel indexed by [1, 1] in the first block $B_1$ and a pixel indexed by [1, 1] in the second block $B_2$ are reconfigured to maintain the minimum dispersion distance D.

The configuration of the blocks may be performed using a predetermined rule, for example, a pseudo code.

Figure 9:
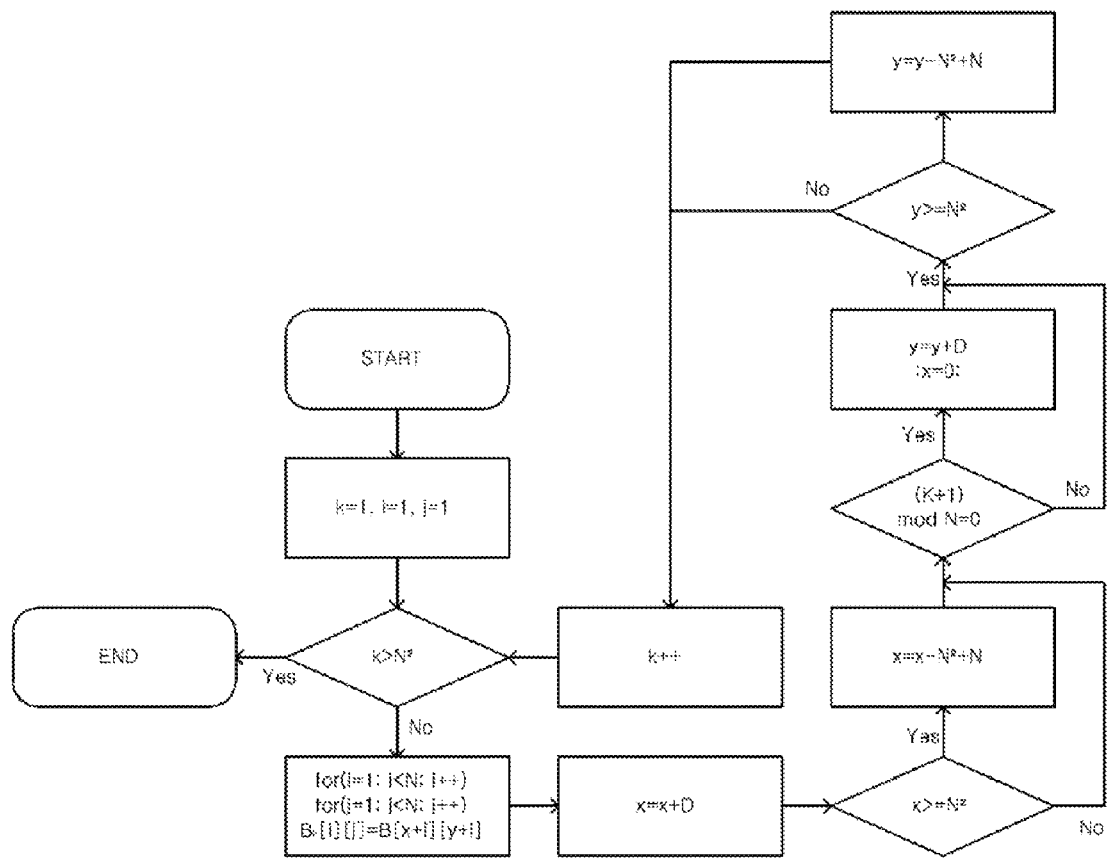
FIG. 9 is a flowchart illustrating the pseudo code of FIG. 8.

FIG. 8 is an example of a pseudo code for reconfiguring a block in S300 according to the present disclosure, and FIG. 9 is a flowchart illustrating the pseudo code of FIG. 8.

Figure 10:
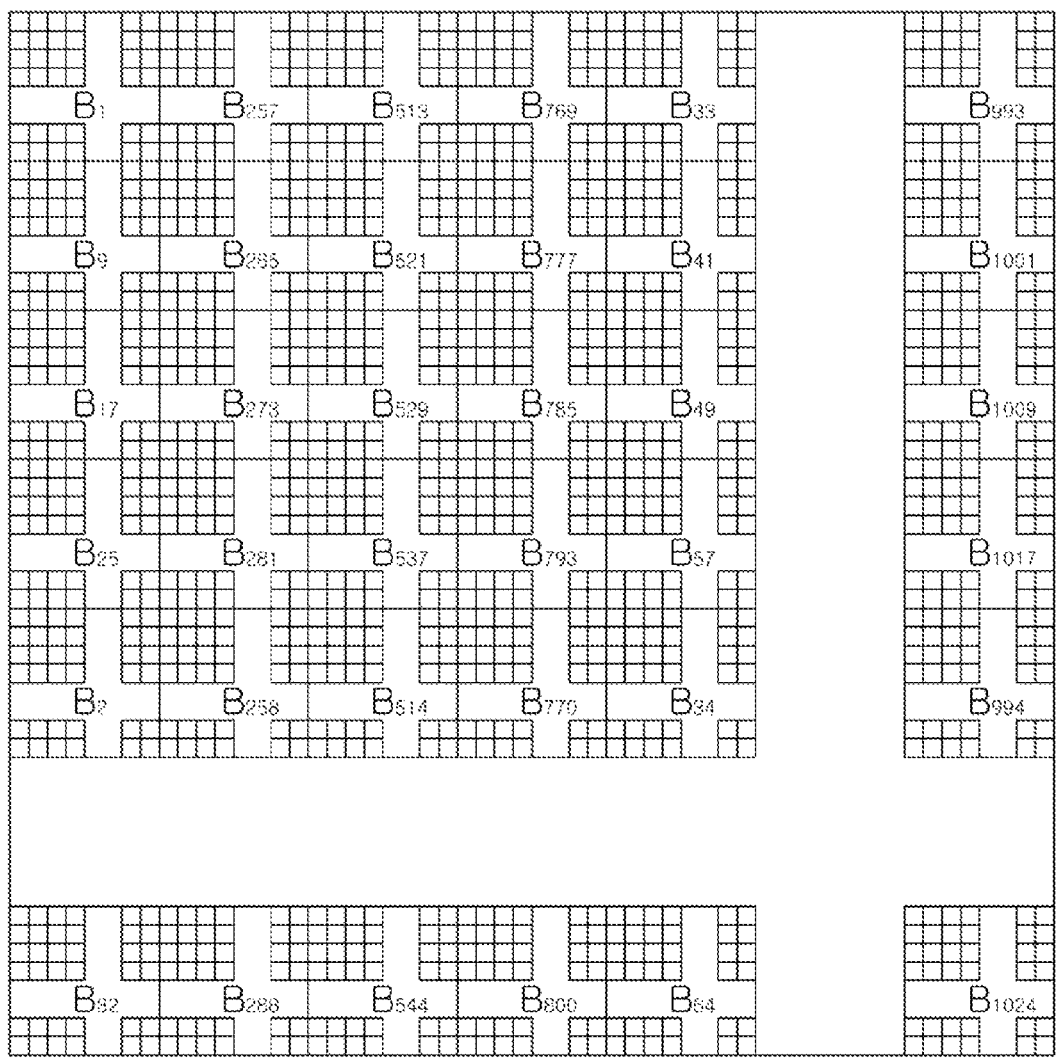
FIG. 10 is a schematic diagram illustrating an example in which a block is reconfigured according to the present disclosure.

FIG. 10 illustrates an example of reconfiguring a block according to the pseudo code of FIG. 8.

Referring to FIG. 10, an example of a block number configuration in a case in which the page size is 1024×1024 pixels and D=128 is shown. On the basis of a first block $B_1$, a second block $B_2$, a thirty-third block $B_{33}$, and a thirty-fourth $B_{34}$ which are previously adjacent to the first block $B_1$ are disposed to be spaced a 128-pixel distance or more from the first block $B_1$ to newly rearrange the data page.

When block numbers are reconfigured, the pixels are relocated to map the same index pixel of blocks of the input data page to the rearranged $k^{th}$ block (S500).

The movement of the pixels uses the following equation:

$$\pi_k[i,j] = B_{[i-1] \times N + j}[\lfloor k/N \rfloor + 1, k \bmod N], k=1, 2, \ldots, N^2 \text{ and } i=j=1, 2, \ldots, N$$

where $\pi$ is a block in which a pixel is moved, k is a block number, [i, j] is an index of a block, and B is a block of an input data page.

According to the equation, ($\lfloor k/N \rfloor + 1$, k mod N)th pixels of all blocks of the input data page are sequentially collected in the reconfigured $k^{th}$ block in the order of original block numbers of the input data page.

For example, assuming that k=1, i=1, and j=1, $\pi_1[1, 1] = B_1[1, 1]$. That is, pixel [1, 1] of the first block $B_1$ of the input data page is stored in pixel [1, 1] of the reconfigured first block $\pi_1$. In addition, assuming that k=1, i=1, and j=2, $\pi_1[1, 2] = B_2[1, 1]$. That is, pixel [1, 1] of the second block $B_2$ of the input data page is stored in pixel [1, 2] of the reconfigured first block $\pi_1$.

Thus, according to the equation, assuming that k=1, pixels [1, 1] of the first block $B_1$, the second block $B_2$, ..., the (N×N)th block $B_{N \times N}$ are sequentially stored in the reconfigured first block $\pi_1$. Thus, according to the interleaving method according to an embodiment of the present disclosure, on the basis of any pixel, pixels neighboring to the pixel after the interleaving are mapped to a pixel spaced at least the certain distance D apart before the interleaving.

Figure 11:
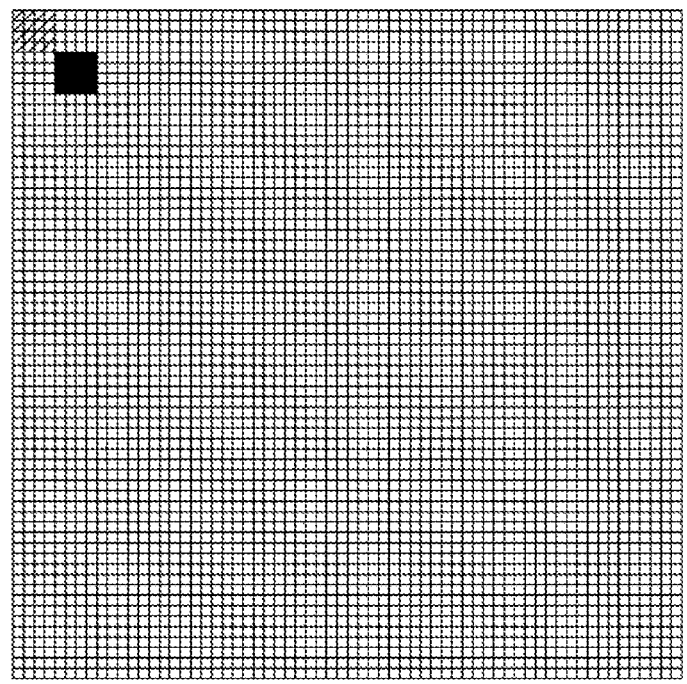
FIG. 11 is a schematic diagram showing an example in which a two-directional interleaving method that secures a dispersion distance according to the present disclosure.
Figure 11:
Figure 11:
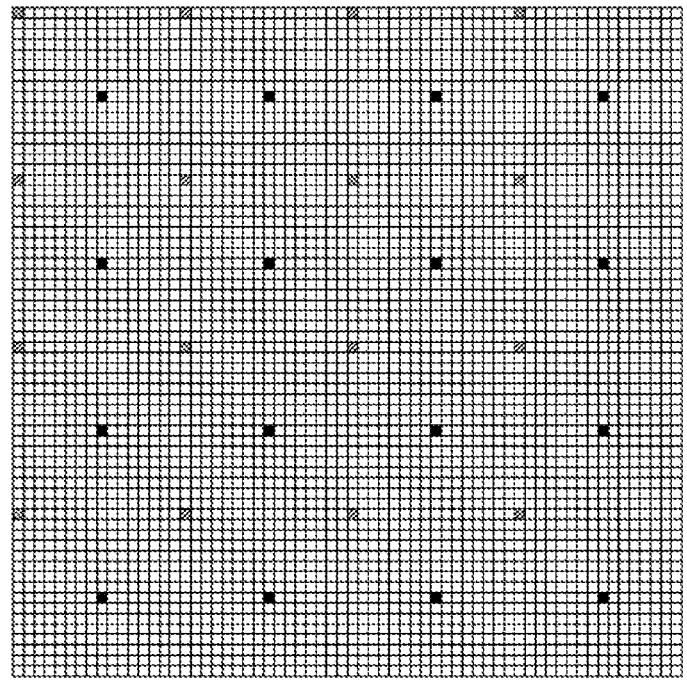

FIG. 11 shows how the errors are spread when the two burst errors of 4×4 occurs in 64×64 pixels.

Referring to FIG. 11, an input data page having 64×64 (=$8^2 \times 8^2$) pixels is divided into 8×8 blocks with each having 8×8 pixels. In this case, two burst errors of 4×4 have occurred in the first block $B_1$ of the input data page.

According to the interleaving of an embodiment of the present disclosure, block numbers of 8×8 blocks are reconfigured, and pixels are moved such that the same index pixel of the blocks of the input data page are mapped to the $k^{th}$ block reconfigured using the equation.

When all of the pixels are relocated, the pixels neighboring to one another in the input data page are mapped to be spaced the minimum dispersion distance D apart, and a modified page created through the mapping is output (S700).

A lower view of FIG. 11 shows a page passed through an interleaver, and it can be seen that burst errors that are dense in the input data pass through the interleaver and thus are evenly spread over the entire page.

According to an embodiment of the present disclosure, it is possible to increase detection efficiency of a signal detector and thus reduce a final bit error ratio by securing the dispersion distance of the burst errors having occurred in the communication and information storage channel. In particular, when the burst errors concentrated in a certain region occurs in a two-dimensional data structure processed in page units, an embodiment of the present disclosure has an effect of evenly spreading the burst errors over the entire page, resulting in a uniform distance between the burst errors.

Figure 12:
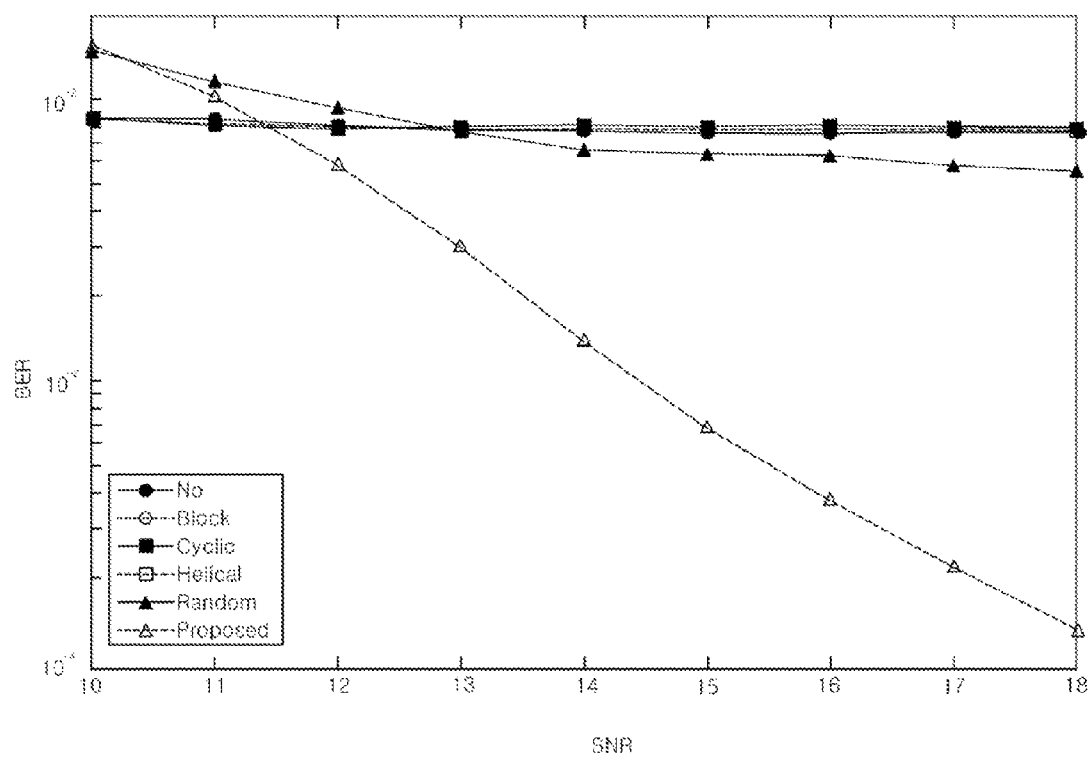
FIG. 12 is a graph illustrating a simulation result of a BER according to an SNR when the two-dimensional interleaving method that secures the dispersion distance according to the present disclosure is implemented in a 1024×1024 page.
Figure 13:
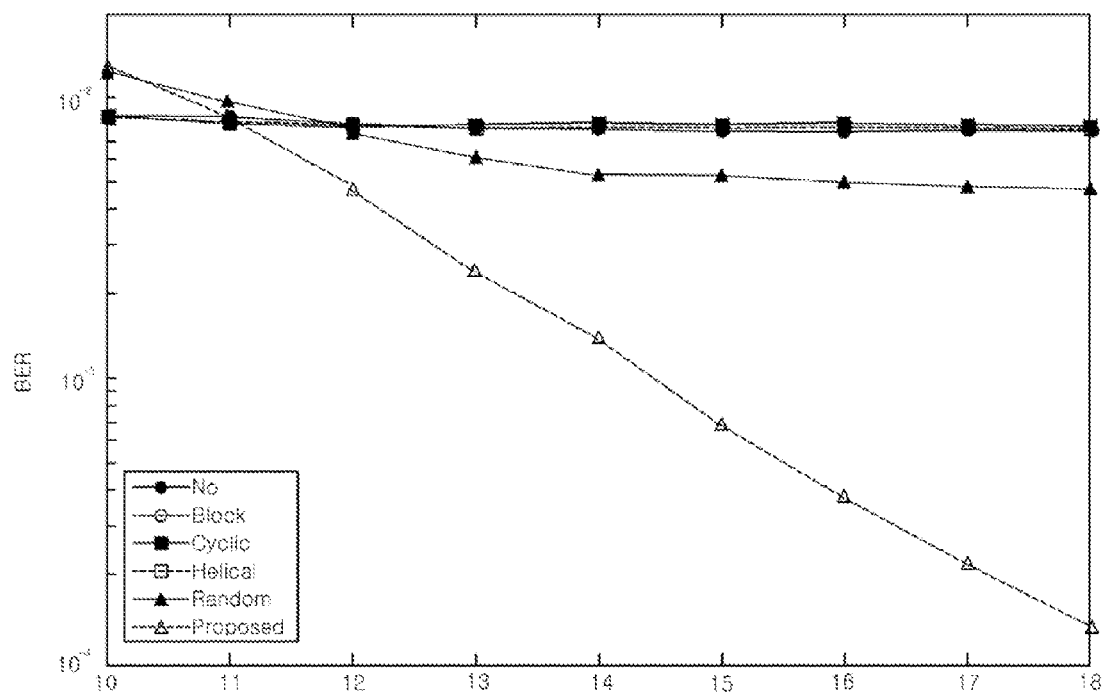
FIG. 13 is a graph illustrating a simulation result of a BER according to an SNR when the two-dimensional interleaving method that secures the dispersion distance according to the present disclosure is implemented in a 900×900 page.

FIGS. 12 and 13 depict comparison results of simulating the present disclosure and the related art technique in order to verify an effect of the present disclosure.

The simulation of FIG. 12 has been experimented using 100 pages of the holographic storage device and the page size of 1024×1024 pixels. The blur was set as 1.85, and deviations of vertical and horizontal directions were assigned 10%, respectively. In addition, (8, 7) even product code has been used, and the number of repetitions is 5.

FIG. 12 shows a result obtained when the page size is 1024×1024 pixels, D=128, and the burst size error is 128×128 pixels and shows bit error ratios (BERs) of (1) None, (2) Block interleaver, (3) Cyclic interleaver, (4) Helical interleaver, (5) Random interleaver, and (6) Interleaver according to an embodiment of the present disclosure.

Upon implementing the interleaving method according to an embodiment of the present disclosure, it can be seen that a BER according to an SNR is significantly low. In particular, the interleaving scheme proposed in an embodiment of the present disclosure exhibits the best performance when the SNR is equal to or greater than 12 dB. This is because burst errors evenly enter a product code one by one, and thus an error may be modified with a correction ability of a product code.

A simulation of FIG. 13 is a result obtained when the page size is 1024×1024 pixels and the burst size error is 120×120 pixels, and it can be seen that a BER for the interleaver according to an embodiment of the present disclosure is good.

The present disclosure has proposed the two-dimensional interleaver that secures the dispersion distance in order to address burst errors. The two-dimensional interleaver according to an embodiment of the present disclosure spreads pixels such that the pixels are spaced a uniform distance apart after performing block packing on blocks according to the minimum dispersion distance, thus exhibiting better performance than another interleaver.

The two-dimensional interleaving method that secures the dispersion distance may be implemented as an application or implemented in the form of program instructions that may be executed through various computer components and recorded on a computer-readable recording medium. The computer-readable recording medium may also include program instructions, data files, data structures, or combinations thereof.

The program instructions recorded on the computer-readable recording medium may be specially designed for the present disclosure or may be well known to those skilled in the art of software.

Examples of the computer-readable recording medium include a magnetic medium, such as a hard disk, a floppy disk, and a magnetic tape, an optical medium, such as a CD-ROM, a DVD, etc., a magneto-optical medium such as a floptical disk, and a hardware device specially configured to store and perform program instructions, for example, a ROM, RAM, flash memory, etc.

Examples of the program instructions include machine codes made by, for example, a compiler using an interpreter as well as high-level language codes executable by a computer. The above exemplary hardware device can be configured to operate as one or more software modules in order to perform processing according to the present disclosure, and vice versa.

According to the two-dimensional interleaving method that secures the dispersion distance, it is possible to increase detection efficiency of a signal detector and thus reduce a final bit error ratio by securing the dispersion distance of the burst errors having occurred in the communication and information storage channel. In particular, when the burst errors concentrated in a certain region have occurred in a two-dimensional data structure processed in page units, an embodiment of the present disclosure has an effect of evenly spreading the burst errors over the entire page, resulting in a uniform distance between the burst errors.

While the example embodiments of the present disclosure and their advantages have been described in detail, it should be understood that various changes, substitutions and alterations may be made herein without departing from the scope of the disclosure. The present disclosure proposes a new interleaving technique with better performance than existing interleavers. In the field of communication and storage devices, burst errors occurring when data passes through a channel may cause a situation in which data recovery is impossible. Accordingly, most transceiver chipsets have an interleaver (transmitting end) and/or a deinterleaver (receiving end) that may serve to transform the burst error into a possible random error by spreading the burst error. Accordingly, in terms of an economic aspect, the present disclosure may be substituted for the existing interleaver and/or deinterleaver in such a transceiver chipset. In particular, the present disclosure may be utilized in a channel that causes a two-dimensional burst error, such as a holographic data storage apparatus, and may be variously applied to the data storage device or a communication scheme.

What is claimed is:

1. A two-dimensional interleaving method for holographic data storage (HDS) comprising:
dividing a first page having $N^2 \times N^2$ pixels, N being a natural number, into a plurality of blocks, wherein each of the plurality of blocks includes N×N pixels;
rearranging each of the plurality of the blocks of the first page into a second page, wherein each of two index located at same position in two adjacent block of the first page, respectively, is rearranged to have at least a dispersion distance D therebetween in the second page; and
relocating an index pixel located at same position of each of the plurality of the blocks of the first page into a k-th block of the second page.

2. The two-dimensional interleaving method of claim 1, wherein the relocating uses the following equation:

$$\pi_k[i,j]=B_{[i-1]\times N+j}[[k/N]+1, k \bmod N], k=1, 2, \ldots, N^2 \text{ and } i=j=1, 2, \ldots, N$$

where π denotes a block of the second page in which the index pixel is relocated, k denotes a natural number, [i, j] denotes an index, and B denotes a block of the first page.

3. The two-dimensional interleaving method of claim 2, wherein [[k/N]+1, k mod N]th-pixel of each and every of the plurality of blocks of the first page is sequentially mapped into the k-th block of the second page in an order of the plurality of blocks of the first page.

4. The two-dimensional interleaving method of claim 1, wherein the relocating further comprises to use a pseudo code.

5. The two-dimensional interleaving method of claim 1, wherein the two-dimensional interleaving method further comprises outputting the second page.

6. A non-transitory computer-readable recording medium recording a computer program for executing the two-dimensional interleaving method for holographic data storage (HDS), the method comprising:

dividing a first page having $N^2 \times N^2$ pixels, N being a natural number, into a plurality of blocks, wherein each of the plurality of blocks includes N×N pixels;

rearranging each of the plurality of the blocks of the first page into a second page, wherein each of two index located at same position in two adjacent block of the first page, respectively, is rearranged to have at least a dispersion distance D therebetween in the second page; and relocating an index pixel located at same position of each of the plurality of the blocks of the first page into a k-th block of the second page.

7. The non-transitory computer-readable recording medium of claim 6, wherein the relocating uses the following equation:

$$\pi_k[i,j]=B_{[i-1]}\times N+j[\lfloor k/N \rfloor+1, k \bmod N], k=1, 2, \ldots, N^2 \text{ and } i=j=1, 2, \ldots, N$$

where π denotes a block of the second page in which the index pixel is relocated, k denotes a natural number, [i, j] denotes an index, and B denotes a block of the first page.

8. The non-transitory computer-readable recording medium of claim 7, wherein [[k/N]+1, k mod N]th-pixel of each and every of the plurality of blocks of the first page is sequentially mapped into the k-th block of the second page in an order of the plurality of blocks of the first page.

9. The non-transitory computer-readable recording medium of claim 6, wherein the relocating further comprise to use a pseudo code.

10. The non-transitory computer-readable recording medium of claim 6, wherein the two-dimensional interleaving method further comprises outputting the second page.

11. A two-dimensional interleaving apparatus for holographic data storage (HDS) comprising:

a block division unit dividing a first page having $N^2 \times N^2$ pixels, N being a natural number, into a plurality of blocks, wherein each of the plurality of blocks includes N×N pixels;

a block rearrangement unit rearranging each of the plurality of the blocks of the first page into a second page, wherein each of two index located at same position in two adjacent block of the first page, respectively, is rearranged to have at least a dispersion distance D therebetween in the second page; and a mapping unit relocating an index pixel located at same position of each of the plurality of the blocks of the first page into a k-th block of the second page.

12. The two-dimensional interleaving apparatus of claim 11, wherein the mapping unit relocates the pixels using the following equation:

$$\pi_k[i,j]=B_{[i-1]}\times N+j[\lfloor k/N \rfloor+1, k \bmod N], k=1, 2, \ldots, N^2 \text{ and } i=j=1, 2, \ldots, N$$

where π denotes a block of the second page in which the index pixel is relocated, k denotes a natural number, [i, j] denotes an index, and B denotes a block of the first page.

13. The two-dimensional interleaving apparatus of claim 12, wherein the mapping unit performs that [[k/N]+1, k mod N]th-pixel of each and every of the plurality of blocks of the first page is sequentially mapped into the k-th block of the second page in an order of the plurality of blocks of the first page.

14. The two-dimensional interleaving apparatus of claim 12, wherein the block rearrangement unit uses a pseudo code.

15. The two-dimensional interleaving apparatus of claim 11, wherein the two-dimensional interleaving apparatus further comprises an outputting unit outputting the second page.

* * * * *